(12) United States Patent
Shin

(10) Patent No.: US 11,361,815 B1
(45) Date of Patent: Jun. 14, 2022

(54) METHOD AND MEMORY DEVICE INCLUDING PLURALITY OF MEMORY BANKS AND HAVING SHARED DELAY CIRCUIT

(71) Applicant: Winbond Electronics Corp., Taichung (TW)

(72) Inventor: Sangho Shin, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/134,126

(22) Filed: Dec. 24, 2020

(51) Int. Cl.
| | |
|---|---|
| *G11C 8/18* | (2006.01) |
| *G11C 11/4091* | (2006.01) |
| *G11C 11/408* | (2006.01) |
| *G11C 7/10* | (2006.01) |
| *G11C 11/4076* | (2006.01) |

(52) U.S. Cl.
CPC ........ *G11C 11/4091* (2013.01); *G11C 7/1072* (2013.01); *G11C 11/4076* (2013.01); *G11C 11/4085* (2013.01); *G11C 11/4087* (2013.01); *G11C 8/18* (2013.01)

(58) Field of Classification Search
CPC ............ G11C 11/4091; G11C 11/4063; G11C 11/4076; G11C 7/1072; G11C 11/4085; G11C 11/4087; G11C 8/18
See application file for complete search history.

(56) References Cited

U.S. PATENT DOCUMENTS

| | | | | |
|---|---|---|---|---|
| 6,088,292 | A | * | 7/2000 | Takahashi ........... G11C 11/4094 365/189.08 |
| 7,583,548 | B2 | | 9/2009 | Kang |
| 9,196,350 | B2 | | 11/2015 | Kim |
| 2001/0010655 | A1 | * | 8/2001 | Manning ................... G11C 8/12 365/230.03 |

(Continued)

FOREIGN PATENT DOCUMENTS

| | | |
|---|---|---|
| CN | 108022610 | 5/2018 |
| JP | H11203867 | 7/1999 |

(Continued)

OTHER PUBLICATIONS

JP3255282B2 original and translation attached (Year: 2002).*

(Continued)

*Primary Examiner* — Mushfique Siddique
(74) *Attorney, Agent, or Firm* — JCIPRNET

(57) ABSTRACT

A memory device includes a plurality of memory banks and a sensing delay circuit. Each of the memory banks is activated by a row active command and is configured to perform a sensing operation based on a sensing enable signal. The sensing delay circuit, that includes a shared delay circuit and a delay path control circuitry, may delay a start of the sensing enable signal by a sensing delay period from an assertion of the row active command. The shared delay circuit is shared to the memory banks and may generate a plurality of delay signals based on the assertion of the row active command. The delay path control circuitry configured to control an electrical path between the shared delay circuit (Continued)

and the memory banks based on the row active command and the plurality of delay signals to output the sensing enable signal to the memory bank.

18 Claims, 6 Drawing Sheets

(56) References Cited

U.S. PATENT DOCUMENTS

| | | | |
|---|---|---|---|
| 2002/0131320 A1* | 9/2002 | Kurjanowicz | G11C 11/408 365/230.03 |
| 2003/0122696 A1 | 7/2003 | Johnson et al. | |
| 2007/0121394 A1* | 5/2007 | Noda | G11C 7/1066 365/194 |
| 2010/0165763 A1 | 7/2010 | Yoon | |
| 2017/0076778 A1* | 3/2017 | Mochida | G11C 11/40618 |

FOREIGN PATENT DOCUMENTS

| | | |
|---|---|---|
| JP | 2007141383 | 6/2007 |
| TW | 508491 | 11/2002 |

OTHER PUBLICATIONS

"Office Action of Taiwan Counterpart Application", dated Nov. 19, 2021, p. 1-p. 6.
"Office Action of Japan Counterpart Application", dated Feb. 8, 2022, p. 1-p.3.

* cited by examiner

METHOD AND MEMORY DEVICE INCLUDING PLURALITY OF MEMORY BANKS AND HAVING SHARED DELAY CIRCUIT

BACKGROUND

Technical Field

The disclosure relates to a memory device, and more particularly relates to a method and a memory device having a shared delay circuit.

Description of Related Art

A memory device such as a dynamic random-access memory (DRAM) device may include multiple memory banks. In a memory operation, sense amplifiers are started after sensing amount from an assertion of a row active command to perform the sense operation on the memory banks. It is desired to have same delay amount for all of the memory banks included in the memory device.

However, because of a mismatch of electronic components (e.g., transistors, resistors, bias level noise, etc) during manufacturing processes, the delay amount from the assertion of the row active command to the start of the sense amplifier for different memory banks are different. The difference of the delay amount in the memory banks may cause an increase of error rates of the memory operation (e.g., a read operation or a write operation), thereby reducing performance of the memory device.

As a demand for high quality memory device has grown recently, a creative technique and design for improving the performance of the memory device are desired.

SUMMARY

The disclosure introduces a method and a memory device that are capable of improving the performance of the memory device.

In an embodiment of the disclosure, the memory device includes a plurality of memory banks and a sensing delay circuit. Each of the plurality of memory banks is activated by a row active command and each of the plurality of memory banks is configured to perform a sensing operation based on a sensing enable signal. The sensing delay circuit is configured to delay a start of the sensing enable signal by a sensing delay period from an assertion of the row active command. The sensing delay circuit comprises a shared delay circuit and a delay path control circuitry. The shared delay circuit is configured to generate a plurality of delay signals based on the assertion of the row active command, wherein the shared delay circuit is shared for the plurality of memory banks. The delay path control circuitry is coupled to the shared delay circuit and is configured to control an electrical path between the shared delay circuit and the plurality of memory banks based on the row active command and the plurality of delay signals to output the sensing enable signal to the memory bank.

In an embodiment of the disclosure, the method that is adapted to a memory device comprising a plurality of memory banks and a sensing delay circuit. The method includes operations of receiving a row active command that is configured to activate a memory bank among the plurality of memory banks and delaying, by the sensing delay circuit, a start of the sensing enable signal by a sensing delay period from an assertion of the row active command. The operation of delaying the start of the sensing enable signal by the sensing delay period from the assertion of the row active command comprises generating, by a shared delay circuit of the sensing delay circuit, a plurality of delay signals based on the assertion of the row active command, wherein the shared delay circuit is shared for the plurality of memory banks; and controlling an electrical path between the shared delay circuit and the plurality of memory banks based on the row active command and the plurality of delay signals to output the sensing enable signal to the memory bank.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
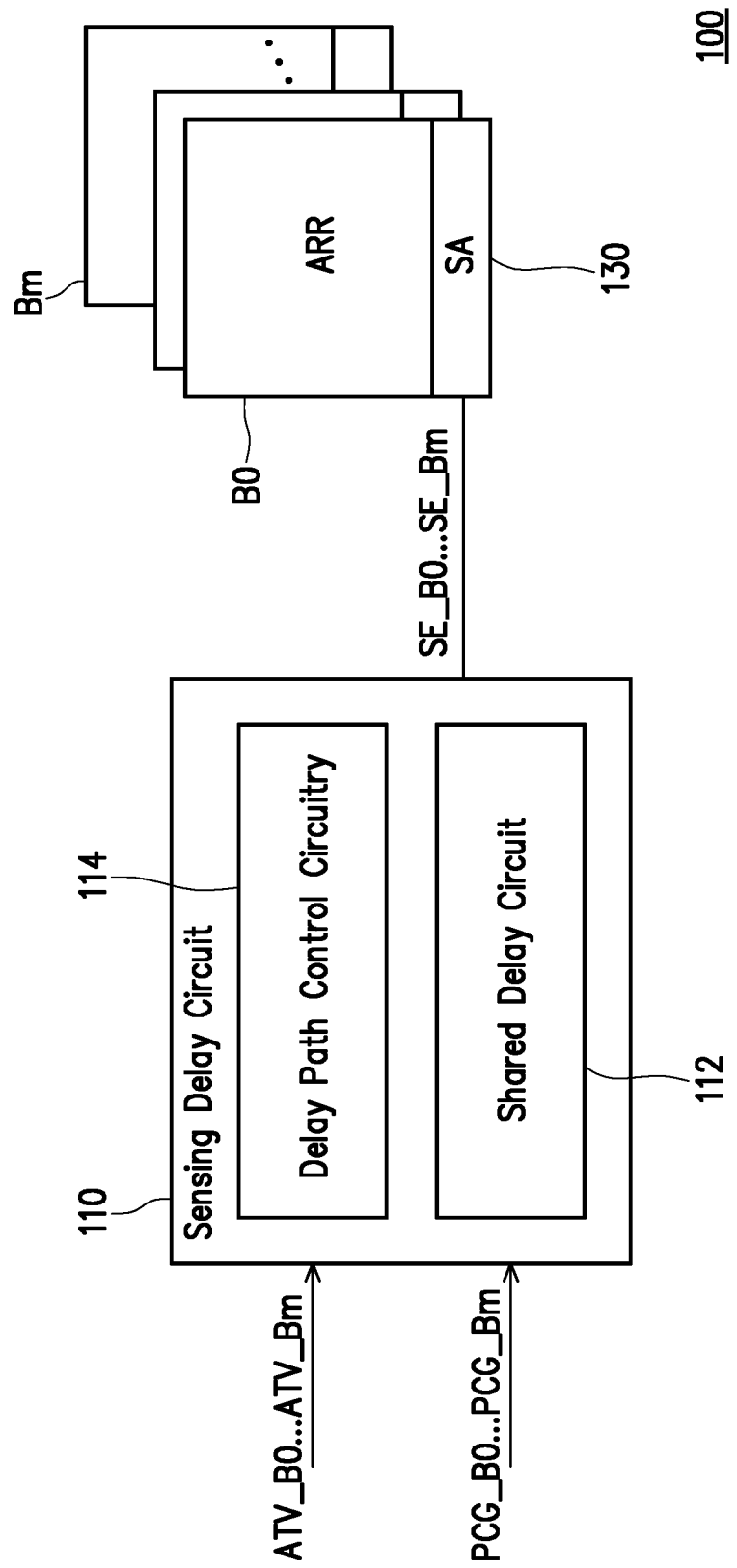
FIG. 1 is a schematic diagram of illustrating memory device in accordance with some embodiments.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, a memory device 100 includes a delay sensing circuit 110 and a plurality of memory banks B0 through Bm that are coupled to the delay sensing circuit 110, in which m is a positive integer. Each of the memory banks B0 through Bm may include a memory array ARR and a sense amplifier SA. The memory array ARR may include a plurality of memory cells (not shown) coupled to a plurality of bit lines and words lines; and the sense amplifier SA are configured to perform a sensing operation to memory cells of the memory array ARR based on a sensing enable signal. Memory operations such as read operations or write operations to the memory cells may be performed through the bit lines and words lines coupled to the memory cells of the memory array ARR. In some embodiments, the sensing enable signals SE_B0 through SE_Bm for enabling the sense amplifiers of the memory banks B0 through Bm, respectively are received from the sensing delay circuit 110. In some embodiments, the memory operations may be performed to independently in the memory banks B0 through Bm. For example, a read operation may be performed in the memory bank B0 while a write operation is performing in the memory bank B1. In some embodiments, the memory cells in the array ARR are dynamic random-access memory (DRAM) cells, but the disclosure is not limited thereto.

In some embodiments, to perform a memory operation such as a read operation or a write operation to a specific memory bank, a row active command is asserted to open a row in the specific memory bank before starting the sense amplifier SA. When the row active command is asserted, cell data in the specific memory bank is transferred to a bit line coupled to the sense amplifier SA through charge sharing between the memory cells and the bit line. After a sensing delay period from the assertion of the row active command, the sense amplifier SA is enabled by the sensing enable signal to sense and amplify the data in the bit line. If the sense amplifier 130 starts too early, the cell data will not be fully transferred to sense amplifier 130. If the sense amplifier 130 starts too late, the sense amplifier 130 will not have enough time to fully amplify the cell data for the memory operation. As such, the sensing delay period must be precise for proper operations of the memory device 100. In addition, the same sensing delay period for all memory banks of the memory device 100 is desired to improve the performance of the memory device 100.

In some embodiments, the sensing delay circuit 110 is configured to receive row active commands ATV_B0 through ATV_Bm and pre-charge signals PCG_B0 through PCG_Bm, and to output sensing enable signals SE_B0 through SE_Bm for the memory banks B0 through Bm, in which the sensing delay periods for the memory banks B0 through Bm are substantially same. The sensing delay period for a specific memory bank is from the assertion of the row active command for the specific memory bank to the start of the sense amplifier SA of the specific memory bank.

In some embodiments, the sensing delay circuit 110 includes a shared delay circuit 112 and a delay path control circuitry 114. The shared delay circuit 112 is shared for all the memory banks B0 through Bm and is configured to delay the start of the sense amplifier SA by the sensing delay period from the assertion of the row active command. The shared delay circuit 112 may receive the row active command for the specific memory bank among the memory banks B0 through Bm and generates at least one delay signal based on the row active command. The at least one delay signal that is generated by the shared delay circuit 112 is provided to the delay path control circuitry 114. The delay path control circuitry 114 is configured to control electrical paths between the shared delay circuit 112 and the memory banks B1 through Bm. In some embodiments, the delay path control circuitry 114 may selectively enable or disable the electrical paths between the shared delay circuit 112 and the memory banks B0 through Bm, thereby providing sensing enable signals with desired sensing delay period to the memory banks B0 through Bm. In some embodiments, both the shared delay circuit 112 and the delay path control circuitry 114 are shared for all the memory banks B0 through Bm.

In some embodiments, the sense amplifiers SA of the memory banks B0 through Bm operate according to the sensing enable signals SE_B0 through SE_Bm, respectively. For example, the sense amplifiers SA are activated when the sensing enable signals have a first logic state (e.g., logic state of 1), and the sense amplifier SA are deactivated when the sensing enable signals have a second logic state (e.g., logic state of 0). The start of the sense amplifiers SA refers to the timing where the logic state of the sensing enable signal changes from the second logic state to the first logic state. The present disclosure is not limited to any particular structure or design of the sense amplifier SA. In some embodiments, the memory device 100 may include additional circuits a controller (not shown), a row decoder (not shown), a column decoder (not shown), a read and write circuitry (not shown), an input/output circuit (not shown) or any other circuits that are needed for proper operations of the memory device 100.

Figure 2:
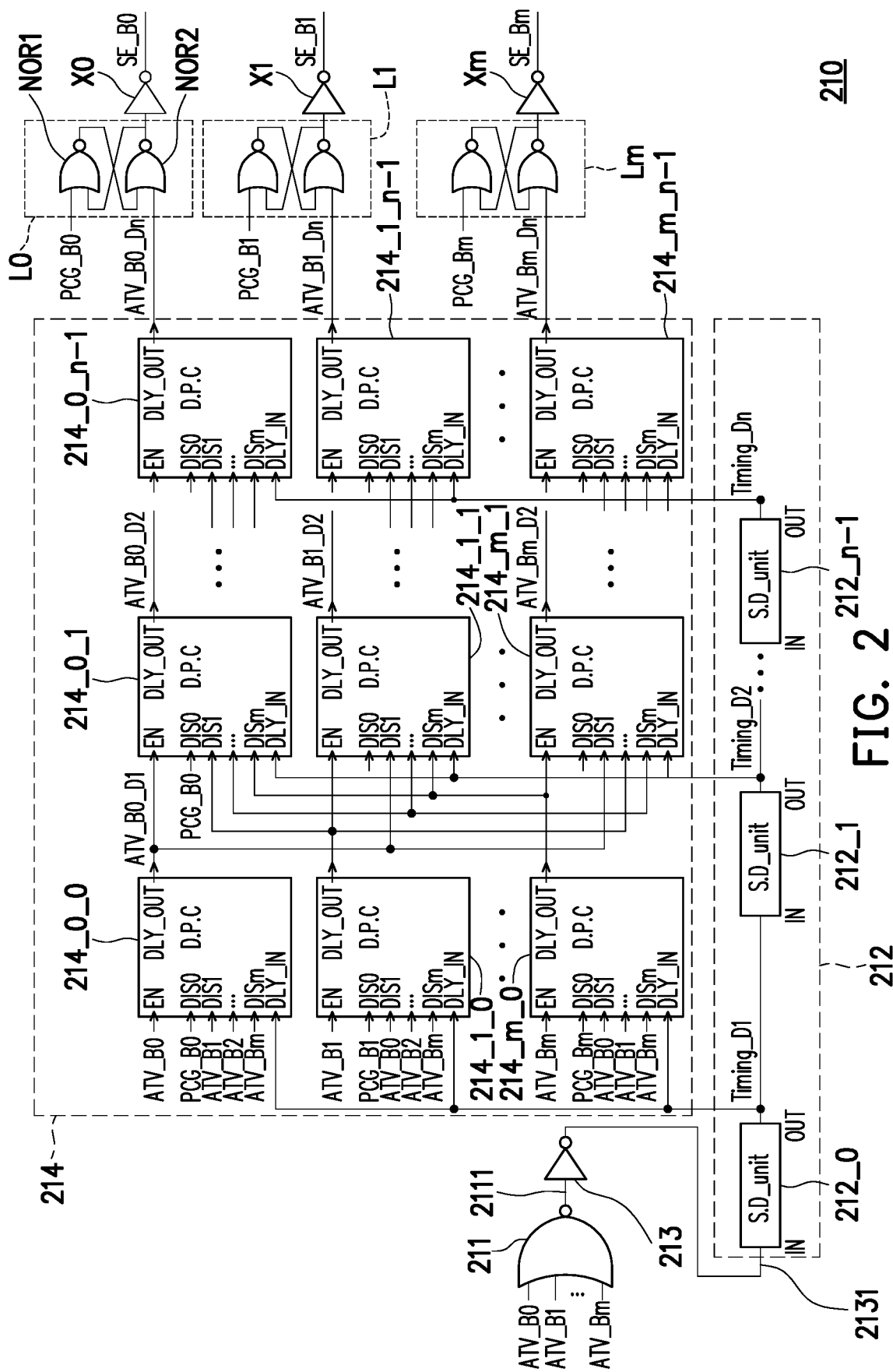
FIG. 2 is a schematic diagram illustrating a sensing delay circuit of a memory device in accordance with some embodiments.

FIG. 2 illustrates a schematic diagram of a sensing delay circuit 210 in accordance with some embodiments. In some embodiments, the sensing delay circuit 210 in FIG. 2 is the sensing delay circuit 110 shown in FIG. 1. The sensing delay circuit 210 may include a shared delay circuit 212 and a delay path control circuitry 214, a plurality of latches L0 through Lm and logic circuits 211, 213 and X0 through Xm. The logic circuit 211 may receive a plurality of row active commands ATV_B0 through ATV_Bm that are for activating the memory banks B0 through Bm, respectively. The logic circuit 211 is configured to perform a logic operation to the row active commands ATV_B0 through ATV_Bm to generate a signal 2111. The signal 2111 may indicate whether at least one of the row active commands ATV_B0 through ATV_Bm is asserted. For example, the signal 2111 may have the first logic state (e.g., logic state of 0) when the at least one of the row active commands ATV_B0 through ATV_Bm is asserted, and the signal 2111 may have the second logic state (e.g., logic state of 1) when none of the row active commands ATV_B0 through ATV_Bm is asserted. In some embodiments, the logic circuit 211 is a NOR logic circuit that is configured to perform a NOR logic operation to the row active commands ATV_B0 through ATV_Bm to generate the signal 2111.

In some embodiments, the logic circuit 213 is coupled to the logic circuit 211 to receive the signal 2111 and is configured to perform a logic operation to the signal 2111 to generate and output the signal 2131 to the shared delay circuit 212. The logic circuit 213 may be a NOT logic circuit that is configured to invert the signal 2111 to generate the signal 2131. In some embodiments, the signal 2111 that is outputted by the logic circuit 211 is outputted directly to the shared delay circuit 212 without going through the logic circuit 213.

In some embodiments, the shared delay circuit 212 includes a plurality of delay units 212_0 through 212_$n$–1 that are coupled in series to form a delay chain, in which n is a positive integer. The number of n may be determined based on a specification of each of the delay units 212_0 through 212_$n$–1 and a desired length of the sensing delay period. The shared delay circuit 212 is configured to delay the start of the sensing enable signals SE_B0 through SE_Bm by the sensing delay period from the assertion of the row active commands ATV_B0 through ATV_Bm. In some embodiments, the shared delay circuit 212 is shared for all memory banks B0 through Bm; and the sensing delay periods for the sensing enable signals SE_B0 through SE_Bm are substantially same. For example, the sensing delay period between the assertion of the row active command ATV_B0 and the start of the sensing enable signal SE_B0 is substantially same as the sensing delay period between the assertion of the row active command ATV_Bm and the start of the sensing enable signal SE_Bm.

In some embodiments, each of the delay units 212_0 through 212_$n$–1 includes an input terminal IN and an output terminal OUT, and is configured to delay the signal at the input terminal IN by a delay period to generate the signal at the output terminal OUT. For example, the delay unit 212_0 is configured to delay the signal 2131 by a delay period to generate the delay signal Timing_D1; the delay unit 212_1 is configured to delay the signal Timing_D1 by a delay period to generate the delay signal Timing_D2; and delay unit 212_$n$-1 is configured to delay a signal inputted to the delay unit 212_$n$-1 to generate the delay signal Timing_Dn. Since the delay units 212_0 through 212_$n$-1 are coupled in series, the delay amount of the delay signal Timing_Dn from the assertion of the row active command is determined according to a sum of delay periods from all of the delay units 212_0 through 212_$n$-1. In some embodiments, the sensing delay period between the assertion of row active command and the start of each corresponding sensing enable signals SE_B0 through SE_Bm is determined according to sum of delay periods from all of the delay units 212_0 through 212_$n$-1.

In some embodiments, the delay path control circuitry 214 is configured to control electrical paths between the shared delay circuit 212 and the memory banks B0 through Bm. In some embodiments, the delay path control circuitry 214 may enable the electrical paths from the shared delay circuit 212 to a target memory bank and disable the electrical paths from the shared delay circuit 212 to other memory banks. In some embodiments, the delay path control circuitry 214 includes a plurality of delay path control circuits 214_0_0 through 214_$m$_$n$-1, in which m and n are positive integers. The delay path control circuitry 214 may selectively enable and disable the delay path control circuits 214_0_0 through 214_$m$_$n$-1 to control the electrical paths between the shared delay circuit 212 and the memory banks B0 through Bm.

In some embodiments, each of the delay path control circuits 214_0_0 through 214_$m$_$n$-1 includes a plurality of input terminals and an output terminal DLY_OUT. The input terminals may include an enable input terminal EN that is configured to receive one of the row active commands ATV_B0 through ATV_Bm, input terminals DIS0 through DISm that are configured to receive other ones of the row active commands ATV_B0 through ATV_Bm, and a delay input terminal DLY_IN that is configured to receive one of the delay signals Timing_D1 through Timing_Dn from the shared delay circuit 212. Each of the delay path control circuits 214_0_0 through 214_$m$_$n$-1 is enabled or disabled through the one of the row active commands ATV_B0 through ATV_Bm that is inputted to the enable input terminal EN. When a specific delay path control circuit among the delay path control circuits 214_0_0 through 214_$m$_$n$-1 is enabled, the delay signal that is inputted to the delay input terminal DLY_IN is outputted to the output terminal DLY_OUT of the specific delay path control circuit.

In some embodiments, the delay path control circuits 214_0_0 through 214_$m$_$n$-1 are divided into a plurality of groups of delay path control circuits, in which each of the groups corresponds to one of the memory banks B0 through Bm. For example, the group of delay path control circuits 214_0_0 through 214_0_$n$-1 corresponds to the memory bank B0 and is configured to enable or disable electrical paths to the memory bank B0; and the group of delay path control circuit 214_$m$_0 through 214_$m$_$n$-1 corresponds to the memory bank Bm and is configured to enable or disable electrical paths to the memory bank Bm. In some embodiments, the group of the delay path control circuits that corresponds to the target memory bank is enabled and the other groups are disabled. For example, when the row active command ATV_B0 is asserted to the sensing delay circuit 210, the group of delay path control circuits 214_0_0 through 214_0_$n$-1 is enabled sequentially to generate the sensing enable signal SE_B0 and the other groups of the delay path control circuits are disabled. When the row active command ATV_B0 is asserted to the enable input terminal EN of the delay path control circuit 214_0_0, the row active command ATV_B0 enables the delay path control circuit 214_0_0 first, and then the output terminal DLY_OUT of delay path control circuit 214_0_0 enables the delay path control circuit 214_0_1. Similarly, the delay path control circuits 214_0_2 through 214_0_$n$-1 are enabled sequentially to generate the sensing enable signal SE_B0. In other words, the electrical path between the shared delay circuit 212 and the memory bank B0 is enabled while the electrical paths between the shared delay circuit 212 and the other memory banks B1 through Bm are disabled. In this way, the sensing enable signal SE_B0 for the memory bank B0 is generated, in which the start of the sensing enable signal SE_B0 is delayed by the sensing delay period from the assertion of the row active command ATV_B0. In addition, since the same shared delay circuit 212 is used to generate the sensing enable signals SE_B0 through SE_Bm, the sensing delay periods from the assertion of the row active commands ATV_B0 through ATV_Bm to the starts of the sensing enable signals SE_B0 through SE_Bm are the same, regardless of offsets or mismatches existed in the delay sensing circuit 210.

In some embodiments, the plurality of latches L0 through Lm are coupled between the delay path control circuitry 214 and logic circuits X0 through Xm (e.g., NOT logic circuits) and is configured to perform latching operations to generate latching signals. The latching signals may be provided to the logic circuits X0 through Xm that are configured to perform a logic operation to the latching signals to output the sensing enable signals SE_B0 through SE_Bm, respectively. In some alternative embodiments, the latching signals that are outputted by the latches L0 through Lm are used as the sensing enable signals for enabling the sense amplifiers 130. In other words, it is optional to include the logic circuits X0 through Xm in the sensing delay circuit 210. Each of the latches L0 through Lm may receive one of the signals ATV_B0_Dn through ATV_Bm_Dn and one of the pre-charge signals PCG_B0 through PCG_Bm and may perform the latching operation based on the received signals for generating one of sensing enable signals SE_B0 through SE_Bm. For example, the latch L0 is configured to perform the latching operation based on the signal ATV_B0_Dn received from the delay path control circuit 214_0_$n$-1 and the pre-charge signal PCG_B0 for generating the sensing enable signal SE_B0. In some embodiments, each of the latches L0 through Lm includes logic circuits NOR1 and NOR2, in which the logic circuit NOR1 is coupled to receive the output of the logic circuit NOR2 and the one of the pre-charge signals PCG_B0 through PCG_Bm. The logic circuit NOR2 is coupled to receive the output of the logic circuit NOR1 and the one of the signals ATV_B0_Dn through ATV_Bm_Dn.

In some embodiments, the sensing enable signals SE_B0 through SE_Bm are activated upon the assertion of the signals ATV_B0_Dn through ATV_Bm_Dn and are deactivated upon the assertion of the pre-charge signals PCG_B0 through PCG_Bm. For example, latch L0 is configured to activate the sensing enable signal SE_B0 when the signal ATV_B0_Dn is asserted to the latch L0 and to deactivate the sensing enable signal SE_B0 when the pre-charge signal PCG_B0 is asserted. In some embodiments, the latches L0 through Lm are coupled to logic circuits X0 through Xm (e.g., NOT logic circuit), respectively, and are configured to perform a logic operation (e.g., NOT operation) to generate the sensing enable signals SE_B0 through SE_Bm. In this way, the sensing enable signals SE_B0 through SE_Bm for the memory banks B0 through Bm are generated by the sensing delay circuit 210, in which the sensing delay period from the assertion of the row active commands ATV_B0 through ATV_Bm to the start of the sensing enable signals SE_B0 through SE_Bm are substantially same.

Figure 3:
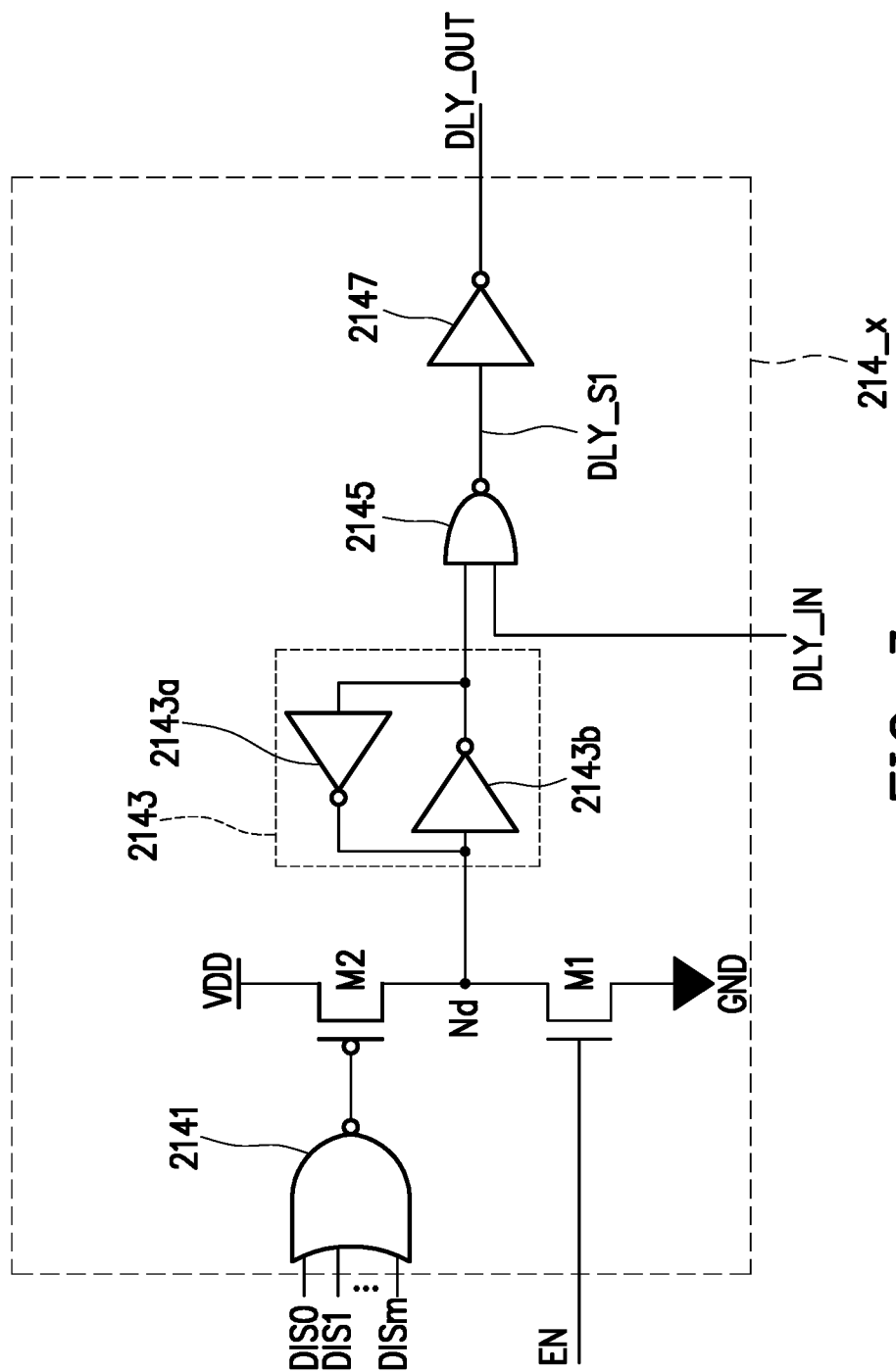
FIG. 3 is a schematic diagram illustrating a delay path control circuit of a memory device in accordance with some embodiments.

FIG. 3 illustrates a schematic diagram of a delay path control circuit 214_x that could be any one of the delay path control circuits 214_0_0 through 214_m_n-1 of the delay path control circuitry 214 shown in FIG. 2. The delay path control circuit 214_x may include a NOR logic circuit 2141, transistors M1, M2, a buffer 2143, a NAND logic circuit 2145 and a NOT logic circuit 2147. In some embodiments, the transistor M1 is coupled between a reference node GND and a connection node Nd that is a connection node between the transistors M1 and M2. The control terminal of the transistor M1 is coupled to the enable input terminal EN of the delay path control circuit 214_x and is configured to receive one of the row active commands ATV_B0 through ATV_Bm. The transistor M1 is configured to electrically connect the reference node GND to the connection node Nd when the one of the row active commands ATV_B0 through ATV_Bm at the enable input terminal EN is asserted.

In some embodiments, the NOR logic circuit 2141 is coupled to the input terminals DIS0 through DISm of the delay path control circuit 214_x to receive the other ones of the row active commands ATV_B0 through ATV_Bm and a pre-charge signal corresponding to one of the memory banks B0 through Bm (also referred to as a self bank pre-charge signal). The NOR logic circuit 2141 is configured to perform a NOR logic operation to the signals at the input terminals DIS0 through DISm to generate an output signal, and provide the output signal to the gate terminal of the transistor M2. The transistor M2 is coupled between a reference node VDD and the connection node Nd, and is configured to electrically connect the reference node VDD to the connection node Nd when the output signal from the NOR logic circuit 2141 is asserted. As such, the connection node Nd is electrically coupled to the reference node GND when the signal at the enable input terminal EN is asserted, and the connection node Nd is electrically coupled to the reference node VDD when any one of the signals at the input terminals DIS0 through DISm is asserted.

In some embodiments, the buffer 2143 includes NOT logic circuits 2143a and 2143b, in which the input of the NOT logic circuit 2143a is the output of the NOT logic circuit 2143b and the input of the NOT logic circuit 2143b is the output of the NOT logic circuit 2143a. The buffer 2143 may be coupled between the connection node Nd and an input terminal of the NAND 2145. In some embodiments, input terminals of the NAND logic circuit 2145 are coupled to the delay input terminal DLY_IN of the delay path control circuit 214_x and the buffer 2143, and the NAND logic circuit 2145 is configured to perform a NAND logic operation to the received signals to generate a signal DLY_S1. The signal at the delay input terminal DLY_IN is one of the delay signals Timing_D1 through Timing_Dn that are received from the shared delay circuit (e.g., shared delay circuit 212 in FIG. 2). The NAND logic circuit 2145 is configured to activate the signal DLY_S1 when the signal at the enable input terminal EN of the delay path control circuit 214_x is asserted, and to deactivate the signal DLY_S1 when any one of the signals at the input terminals DIS0 through DISm is asserted. In this way, the delay path control circuit 214_x may control the electrical paths between the shared delay circuit (e.g., shared delay circuit 212 in FIG. 2) and the memory banks B0 through Bm. In some embodiments, the NOT logic circuit 2147 is configured to perform a NOT logic operation to the signal DLY_S1 that is outputted by the NAND logic circuit 2145 to generate the signal at the output terminal DLY_OUT of the delay path control circuit 214_x. In some embodiments, the signal at the output terminal DLY_OUT of the delay path control circuit 214_x is delayed by the delay period from the assertion of the signal at the enable input signal EN.

Figure 4:
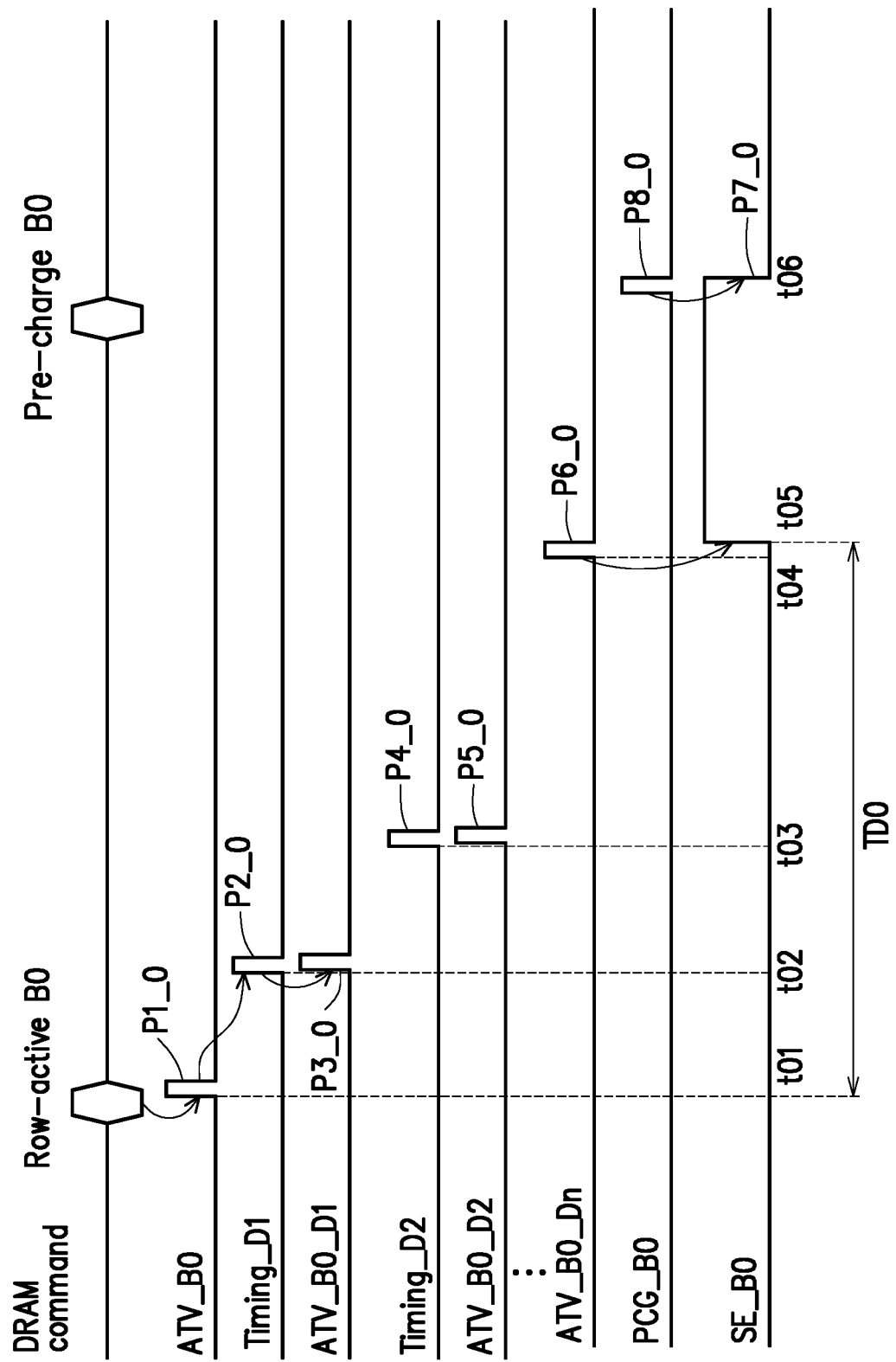
FIGS. 4-5 are waveform diagrams illustrating signals in the memory device in accordance with some embodiments.

FIG. 4 illustrates exemplary waveforms of signals in a delay sensing circuit (e.g., delay sensing circuit 210 in FIG. 2) when generating a sensing enable signal SE_B0 in accordance with some embodiments. Referring to FIG. 2 and FIG. 4, at timing t01, a row active command ATV_B0 with a pulse P1_0 is asserted to the sensing delay circuit 210 for activating the memory bank B0 of the memory device (e.g., memory device 100 in FIG. 1). At timing t02, a pulse P2_0 of the delay signal Timing_D1, outputted from the delay unit 212_0 is asserted to the delay path control circuit 214_0_0 and the delay unit 212_1. The delay path control circuit 214_0_0 is configured to generate a signal ATV_B0_D1 with a pulse P3_0; and the delay unit 212_1 is configured to generate the delay signal Timing_D2 with pulses P4_0 based on the delay signal Timing_D1. The time period between the timings t01 and t02 is the delay period of a signal passing through delay unit 212_0. The signal ATV_B0_D1 is delayed from the row active command ATV_B0 by the time period of the delay unit 212_0.

At timing t03, the delay signal Timing_D2 with the pulse P4_0 is outputted from the delay unit 212_1 to the delay path control circuit 214_0_1 and the delay unit 212_2 (not shown). The delay path control circuit 214_0_1 is configured to generate a signal ATV_B0 D2 with a pulse P5_0. The time period between the timing t02 and t03 is the delay period of a signal passing through delay unit 212_1; and the signal ATV_B0 D2 is delayed from the signal ATV_B0_D1 by the time period of the delay unit 212_1.

Similarly, the signal ATV_B0_Dn with a pulse P6_0 is outputted from the delay path control circuit 214_0_n-1 at timing t04, and the sensing enable signal SE_B0 with a pulse P7_0 is started at timing t5. A time period between the timings t1 and t5 is the sensing delay period TD0 from the assertion of the row active command ATV_B0 to the start of the sensing enable signal SE_B0. At timing t6, the sensing enable signal SE_B0 is deactivated with the assertion of a pre-charge signal PCG_B0 with a pulse P8_0. In this way, the sensing delay circuit 210 may generate the sensing delay signal SE_B0 for the memory bank B0, in which the start of the sensing delay signal SE_B0 is delayed by the sensing delay period TD0 from the assertion of the row active command ATV_B0.

Figure 5:
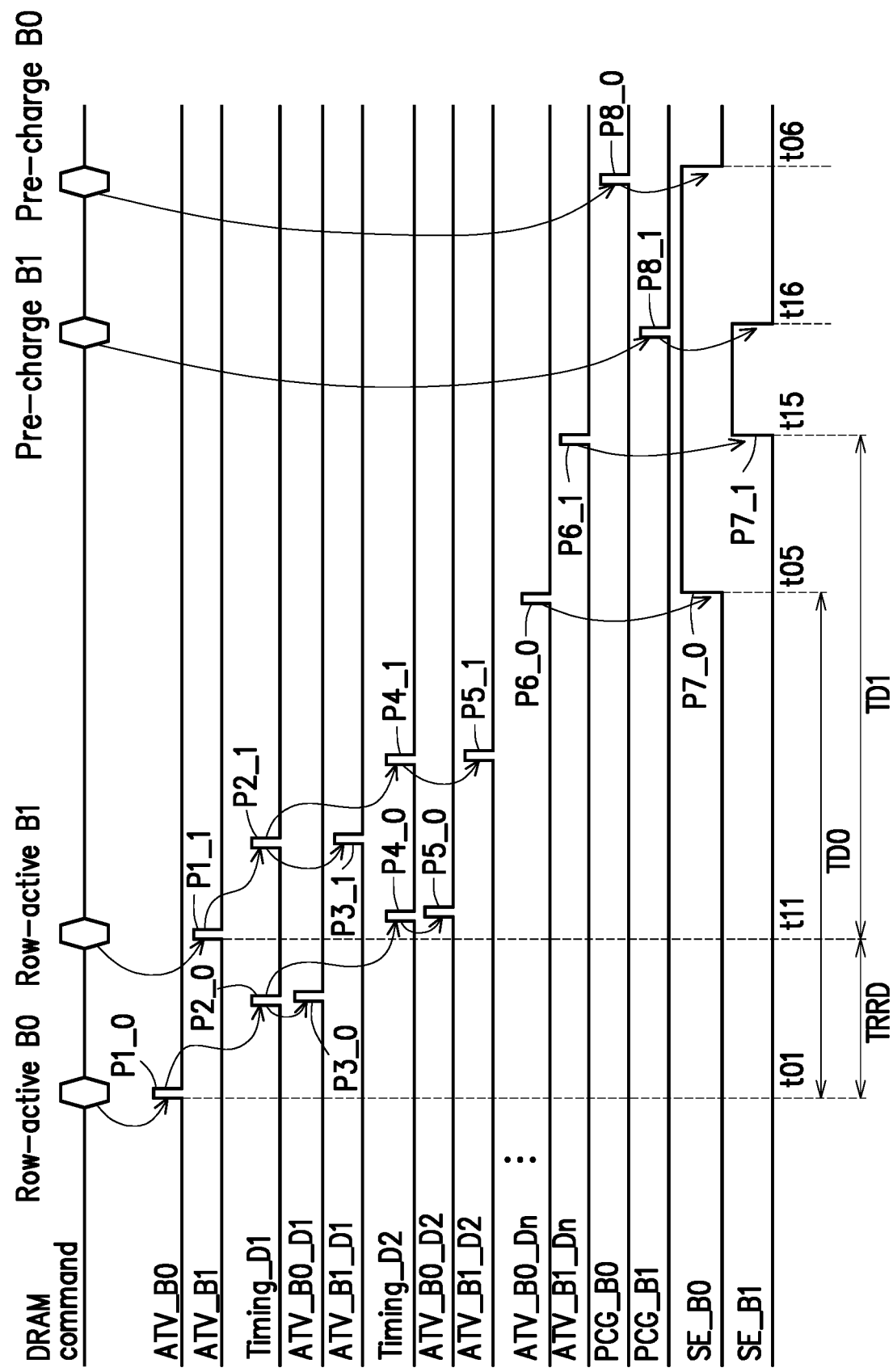

FIG. 5 illustrates exemplary waveforms of signals in a delay sensing circuit (e.g., delay sensing circuit 210 in FIG. 2) when generating sensing enable signals SE_B0 and SE_B1 in accordance with some embodiments. Referring to FIG. 2 and FIG. 5, row active commands ATV_B0 and ATV_B1 for activating the memory banks B0 and B1 are asserted at timing t01 and t11, respectively. The time period between the timing t01 and t11 must satisfy an active-to-active minimum command period ($T_{RRD}$) of the memory device to assure proper operations of the memory device. In response to the assertion of the row active commands ATV_B0 and ATV_B1, the shared delay circuit 212 generates the delay signals Timing_D1 through Timing_Dn for generation of both sensing enable signals SE_B0 and SE_B1. For example, the delay signal Timing_D1 includes a pulse P2_0 for the generation of the sensing enable signal SE_B0 and a pulse P2_1 for the generation of the sensing enable signal SE_B1. Similarly, the delay signal Timing_D2 includes a pulse P4_0 for the generation of the sensing enable signal SE_B0 and a pulse P4_1 for the generation of the sensing enable signal SE_B1.

In some embodiments, a signal passing through each of the delay units 212_0 through 212_n-1 is delayed by a delay period, in which a length of the delay period is shorter than a length of the $T_{RRD}$ to avoid conflict of multiple row active commands inputted to the delay units 212_0 through 212_n-1. In some embodiments, the delay path control circuitry 214 are configured to generates pulses P3_0, P5_0 and P6_0 in the signals ATV_B0_D1 through ATV_B0_Dn based on the delay signals Timing_D1 through Timing_Dn. Similarly, the delay path control circuitry 214 are configured to generate pulses P3_1, P5_1 and P6_1 in the signals ATV_B1_D1 through ATV_B1_Dn based on the delays signals Timing_D1 through Timing_Dn. The signals ATV_B0_D1 through ATV_B0_Dn are for the generation of the sensing enable signal SE_B0 for the memory bank B0; and the signals ATV_B1_D1 through ATV_B1_Dn are for the generation of the sensing enable signal SE_B1 for the memory bank B1. The pulses P6_0 and P6_1 of the signals ATV_B0_Dn and ATV_B1_Dn triggers the start of pulses P7_0 and P7_1 at timings t05 and t15, respectively. In other words, the pulses P6_0 and P6_1 of the signals ATV_B0_Dn and ATV_B1_Dn triggers the start of the sensing enable signals SE_B0 and SE_B1, respectively. The pulses P7_0 and P7_1 of the sensing enable signals SE_B0 and SE_B1 ends at timings t06 and t16, respectively.

In some embodiments, the sensing delay period TD0 from the assertion of the row active command ATV_B0 at the timing t01 to the start of the sensing enable signal SE_B0 at the timing t05 is substantially same as the sensing delay period TD1 from the assertion of the row active command ATV_B1 at the timing t11 to the start of the sensing enable signal SE_B1 at the timing t15.

Figure 6A:
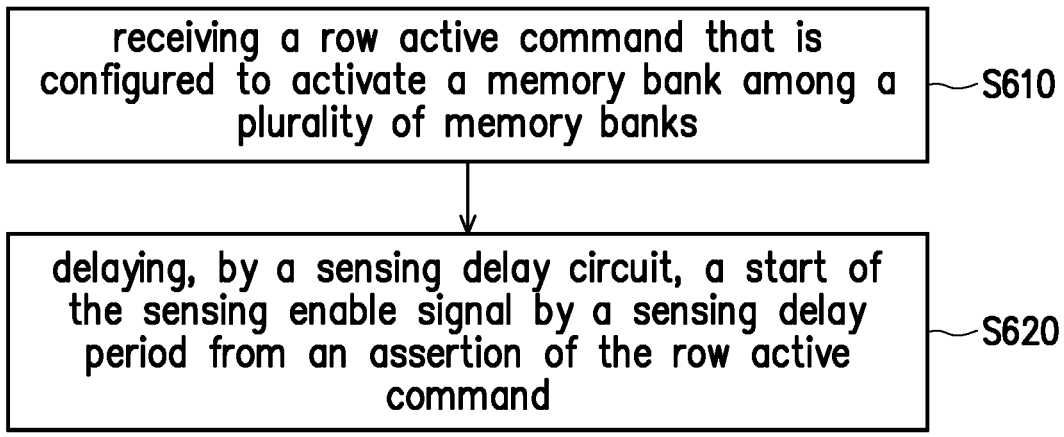
FIGS. 6A through 6B illustrate a flowchart diagram of a method of a memory device in accordance with some embodiments.
Figure 6B:
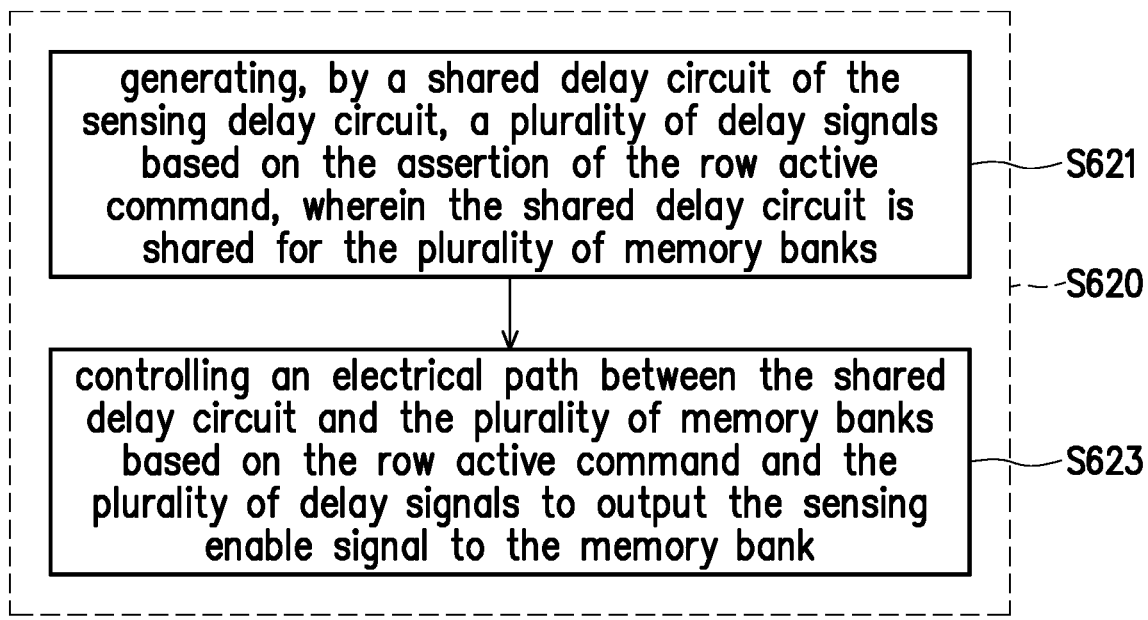

FIG. 6A through 6B illustrates a flowchart diagram of a method adapted for a memory device to generate a delay enabling signal, in which a start of the sensing delay signal is delayed by a sensing delay period from an assertion of a row active command in accordance with some embodiments. In operation S610, a row active command that is configured to activate a memory bank among a plurality of memory banks is received. In operation S620, a start of the sensing enable signal is delayed by a sensing delay circuit of the memory device by a sensing delay period from an assertion of the row active command. The operation S620 may include sub-operations S621 and S623. In the sub-operation S621, a plurality of delay signals is generated by a shared delay circuit of the sensing delay circuit based on the assertion of the row active command, wherein the shared delay circuit is shared for the plurality of memory banks. In operation S623, an electrical path between the shared delay circuit and the plurality of memory banks is controlled based on the row active command and the plurality of delay signals to output the sensing enable signal to the memory bank.

In accordance with the above embodiments, a memory device including a sensing delay circuit that includes a shared delay path circuit and a delay path control circuitry is introduced. The shared delay path circuit is shared for all memory banks in the memory device, and the sensing delay circuit is configured to delay a start of a sensing enable signal for a specific memory bank by a sensing delay period from an assertion of a row active command for the specific memory bank. In this way, the sensing delay periods for all memory banks of the memory device is substantially same, regardless of mismatch or offset of electronic components in the memory device due to variations during manufacturing. In other words, the same sensing delay periods are achieved for all the memory banks included in the memory device. Accordingly, error rates of memory operations such as a reading operation or a writing operation to the memory banks of the memory device is reduced, and performance of the memory device is improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
a plurality of memory banks, wherein each of the plurality of memory banks is activated by a row active command and each of the plurality of memory banks is configured to perform a sensing operation based on a sensing enable signal; and
a sensing delay circuit, configured to delay a start of the sensing enable signal by a sensing delay period from an assertion of the row active command, wherein the sensing delay circuit comprises:
a shared delay circuit, configured to generate a plurality of delay signals based on the assertion of the row active command, wherein the shared delay circuit is shared for the plurality of memory banks, wherein the shared delay circuit comprises a plurality of delay units that are configured to generate the plurality of delay signals, and each of the plurality of delay units is configured to delay the start of the sensing enable signal by a delay period; and
a delay path control circuitry, coupled to the shared delay circuit, configured to control an electrical path between the shared delay circuit and the plurality of memory banks based on the row active command and the plurality of delay signals to output the sensing enable signal to the memory bank,
wherein the plurality of memory banks comprises a first memory bank and a second memory bank that are activated by a first row active command and a second row active command, respectively,
wherein the delay period of each of the plurality of delay units is less than an active-to-active minimum command period of the memory device, and the active-to-active minimum command period is a minimum time period between the assertion of the first row active command and the assertion of the second row active command.

2. The memory device of claim 1, wherein
the sensing delay period from the assertion of the row active command to the start of the sensing enable signal is determined according to a sum of delay periods of the plurality of delay units.

3. The memory of claim 2, wherein
the first memory bank and the second memory bank are configured to perform sensing operations based on a first sensing enable signal and a second sensing enable signal, and
a first sensing delay period from an assertion of the first row active command to a start of the first sensing enable signal is same as a second sensing delay period from an assertion of the second row active command to a start of the second sensing enable signal.

4. The memory device of claim 3, wherein the plurality of memory banks are activated by a plurality of row active commands, and the delay path control circuitry comprises:
- a plurality of delay path control circuits, each of the plurality of delay path control circuits comprises:
  - an enable input terminal, configured to receive one of the plurality of row active commands;
  - a plurality of first input terminals, configured to receive other ones of the plurality of row active commands and a pre-charge signal of one of the plurality of memory banks;
  - a second input terminal, coupled to one of the plurality of delay units of the shared delay circuit, configured to receive the delay signal outputted by the one of the plurality of delay units; and
  - an output terminal, configured to output a delay row active command based on the one of the plurality of row active commands and the delay signal.

5. The memory device of claim 4, wherein each of the plurality of delay path control circuits comprises:
- a first transistor, comprising a control terminal that is coupled to the enable input terminal to receive the one of the plurality of row active commands;
- a first logic circuit, coupled to the plurality of first input terminals, configured to perform a first logic operation to the other ones of the plurality of row active commands to generate a first logic signal;
- a second transistor, coupled to the first logic circuit, wherein the second transistor comprises a control terminal that receives the first logic signal outputted from the first logic circuit, and the second transistor is coupled to the first transistor through a connection node;
- a second logic circuit, coupled to the second input terminal, configured perform a second logic operation to the delay signal from the second input signal and a signal at the connection node to generate a second logic signal;
- a third logic circuit, coupled to the second logic circuit, configured to perform a third logic operation to the second logic signal to generate the delay row active command.

6. The memory device of claim 5, wherein
the first logic circuit is a NOR logic circuit, the second logic circuit is a NAND logic circuit, and the third logic circuit is a NOT logic circuit.

7. The memory device of claim 4, wherein
the plurality of delay path control circuits comprises a first delay path control circuit and a second path control circuit,
the output terminal of the first delay path control circuit is coupled to the enable input terminal of the second delay path control circuit, wherein the second delay path control circuit is enabled or disabled according to the delay row active command that is outputted by the first delay path control circuit.

8. The memory device of claim 4, wherein the plurality of delay path control circuits comprises:
- a first group of delay path control circuits, corresponding to the first memory bank, configured to control an electrical path between the shared delay circuit and the first memory bank according to the first row active command; and
- a second group of delay path control circuits, corresponding to the second memory bank, configured to control an electrical path between the shared delay circuit and the second memory bank according to the second row active command.

9. The memory device of claim 8, wherein
the first group of delay path control circuits is enabled to form the electrical path between the shared delay circuit and the first memory bank according to the first row active command,
the first group of delay path control circuits is disabled according to an assertion of a pre-charge signal of the first memory bank or an assertion of an other row active command for activating an other memory bank that is different from the first memory bank,
the second group of delay path control circuits is enabled to form the electrical path between the shared delay circuit and the second memory bank according to the second row active command, and
the second group of delay path control circuits is disabled according to an assertion of a pre-charge signal of the second memory bank or an assertion of an other row active command for activating an other memory bank that is different from the second memory bank.

10. The memory device of claim 9, wherein
each of the delay units of the shared delay circuit is coupled to one delay path control circuit of the first group of delay path control circuits and one delay path control circuit of the second group of delay path control circuits, and
a quantity of delay path control circuits in each of the first group of delay path control circuits and the second group of delay path control circuits is equal to a quantity of the delay units in the shared delay circuit.

11. The memory device of claim 4, further comprising:
- a fourth logic circuit, configured to receive the plurality of row active commands, perform a fourth logic operation to the plurality of row active commands to generate a delay enable signal, and output the delay enable signal to the shared delay circuit; and
- a plurality of latch circuits, coupled to the delay path control circuitry, configured to generate the sensing enable signal for each of the plurality of memory banks based on an output of the delay path control circuitry.

12. The memory device of claim 1, wherein each of the plurality of memory banks comprises:
- a sense amplifier, configured to perform the sensing operation according to the sensing enable signal.

13. A method, adapted to a memory device comprising a plurality of memory banks and a sensing delay circuit, wherein the plurality of memory banks comprises a first memory bank and a second memory banks that are activated by a first row active command and a second row active command, respectively, the method comprising:
- receiving a row active command that is configured to activate a memory bank among the plurality of memory banks; and
- delaying, by the sensing delay circuit, a start of the sensing enable signal by a sensing delay period from an assertion of the row active command, wherein delaying the start of the sensing enable signal by the sensing delay period from the assertion of the row active command comprises:
  - delaying, by each of the plurality of delay units, the start of the sensing enable signal by a delay period;
  - generating, by a shared delay circuit of the sensing delay circuit, a plurality of delay signals based on the assertion of the row active command, wherein the shared delay circuit is shared for the plurality of memory banks, wherein the shared delay circuit comprises a plurality of delay units; and controlling an electrical path between the shared delay circuit and the plurality of memory banks based on the row active command and the plurality of delay signals to output the sensing enable signal to the memory bank, wherein the delay period of each of the plurality of delay units is less than an active-to-active minimum command period of the memory device, and the active-to-active minimum command period is a minimum time period between the assertion of the first row active command and the assertion of the second row active command.

14. The method of claim 13, wherein the sensing delay period from the assertion of the row active command to the start of the sensing enable signal is determined according to a sum of delay periods of the plurality of delay units.

15. The method of claim 14, wherein the first memory bank and the second memory bank are configured to perform sensing operations based on a first sensing enable signal and a second sensing enable signal, and a first sensing delay period from an assertion of the first row active command to a start of the first sensing enable signal is same as a second sensing delay period from an assertion of the second row active command to a start of the second sensing enable signal.

16. The method of claim 15, further comprising:

controlling an electrical path between the shared delay circuit and the first memory bank according to the first row active command; and controlling an electrical path between the shared delay circuit and the second memory bank according to the second row active command.

17. The method of claim 15, wherein controlling the electrical path between the shared delay circuit and the plurality of memory banks comprises:

enabling a first group of delay path control circuits to form the electrical path between the shared delay circuit and the first memory bank according to the first row active command; and disabling the first group of delay path control circuits according to an assertion of a pre-charge signal of the first memory bank or an assertion of an other row active command for activating an other memory bank that is different from the first memory bank, and controlling the electrical path between the shared delay circuit and the second memory bank according to the second row active command comprises:

enabling a second group of delay path control circuits to form the electrical path between the shared delay circuit and the second memory bank according to the second row active command; and disabling the second group of delay path control circuits according to an assertion of a pre-charge signal of the second memory bank or an assertion of an other row active command for activating an other memory bank that is different from the second memory bank.

18. The memory device of claim 13, wherein controlling the electrical path between the shared delay circuit and the plurality of memory banks comprises:

receiving one of a plurality of row active commands and controlling a first transistor based on the one of the plurality of row active commands;

receiving the other ones of the plurality of row active commands and performing a first logic operation to the other ones of the plurality of row active commands to generate a first logic signal;

controlling a second transistor based on the first logic signal, wherein the second transistor is coupled to the first transistor through a connection node;

performing a second logic operation to a delay signal among the plurality of delay signals and a signal at the connection node to generate a second logic signal; and performing a third logic operation to the second logic signal to generate the delay row active command.

\* \* \* \* \*